United States Patent
Chou

(10) Patent No.: US 7,348,815 B2
(45) Date of Patent: Mar. 25, 2008

(54) ALL-DIGITAL POWER-ON RESET DEVICE

(75) Inventor: Chun-Yen Chou, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 26 days.

(21) Appl. No.: 11/414,862

(22) Filed: May 1, 2006

(65) Prior Publication Data
US 2007/0252626 A1    Nov. 1, 2007

(51) Int. Cl.
*H03L 7/00* (2006.01)
(52) U.S. Cl. .................. 327/142; 327/143; 327/198
(58) Field of Classification Search ........ 327/141–143, 327/198; 326/46
See application file for complete search history.

(56) References Cited

U.S. PATENT DOCUMENTS 6,173,436 B1 *  1/2001  Ciccone et al. ............... 716/19
6,278,302 B1 *  8/2001  El-Kik ......................... 327/143
2006/0261868 A1 * 11/2006  Ju et al. ...................... 327/143

* cited by examiner

*Primary Examiner*—Tuan T. Lam
*Assistant Examiner*—Patrick O'Neill
(74) *Attorney, Agent, or Firm*—Kirkpatrick & Lockhart Preston Gates Ellis LLP

(57) ABSTRACT

A method and system is disclosed for creating a timing delay for power-on reset. A state machine is formed with three states. It resets a counter value to a predetermined number in an initial state, and increments the counter value for a predetermined number of reset cycles in a reset state until the counter value reaches a predetermined value for creating the time delay, and ends the reset state in a finish state if the counter reaches the predetermined value and if a randomly generated value matches a predetermined signature, wherein if in the reset state the randomly generated value does not match the signature or if in the finish state either the counter value does not reach the predetermined value or the randomly generated value does not match the signature, the initial state starts and subsequently enters the reset state after resetting the counter value.

12 Claims, 2 Drawing Sheets

ALL-DIGITAL POWER-ON RESET DEVICE

BACKGROUND

The present invention relates generally to integrated circuit (IC) designs, and more particularly to a method and system used for creating a power-on reset signal.

A power-on reset device (POR) is commonly found in today's integrated circuit designs and is used to perform many different tasks. As an example, the power-on reset device may first be tasked to ensure that the processor starts at a known address when power is first applied to an integrated circuit. To accomplish that task, the POR logic output holds the processor in its reset state when the processor's power supply is first turned on. The POR's second task is then to keep the processor from starting its operation from that known address until certain events have occurred. For example, three events may be required to happen: the system power supplies have stabilized at the appropriate levels; one or more processor's clocks have settled; and the internal registers have been properly loaded. The POR accomplishes this second task through an onboard timer, which continues to hold the processor in its reset state for a prescribed period of time. That timer triggers after the processor's power supply reaches a specific voltage threshold. After a set time elapses, the timer expires, causing the POR output to become inactive, which in turn makes the processor come out of reset to begin operation. The processor's data sheet specifies the required duration of the timer's delay. The timer, incidentally, is the functional element that differentiates a POR from a voltage detector, a device that also detects a voltage threshold, but does not time an event.

However, conventional power-on reset circuit devices use resistance and capacitance (RC) components to generate the power-on reset signal. While these RC components provide an RC characteristic that can be used to determine the duration of the reset, they are not easily controlled. Even if a proper control mechanism is installed, the mechanism is often very cost prohibitive in today's integrated circuit designs.

It is therefore desirable to devise a method and system for performing an all-digital power-on reset.

SUMMARY

In view of the foregoing, this invention provides a method for creating a timing delay in an all-digital power-on reset circuit device without using resistors and capacitors, thereby removing any instability corresponding thereto.

In one embodiment, only logic gate devices are used and no resistors and capacitors are required. An all-digital power-on reset device comprises logic gate devices to create a finite state machine, which is then used to determine whether a power-on reset signal has been generated. By using all digital logic components, the exact length of the reset period can be determined, while the necessity to control unstable RC elements can be eliminated.

In one embodiment, a state machine is formed with three states. It resets a counter value to a predetermined number in an initial state, increments the counter value for a predetermined number of reset cycles in a reset state until the counter value reaches a predetermined value for creating the time delay, and ends the reset state in a finish state if the counter reaches the predetermined value and if a randomly generated value matches a predetermined signature, wherein if in the reset state the randomly generated value does not match the signature or if in the finish state either the counter value does not reach the predetermined value or the randomly generated value does not match the signature, the initial state starts and subsequently enters the reset state after resetting the counter value.

The construction and method of operation of the invention, however, together with additional objects and advantages thereof will be best understood from the following description of specific embodiments when read in connection with the accompanying drawings.

DESCRIPTION

The present disclosure provides a method and system for performing power-on reset. According to the embodiments of the present invention, a timing delay is created in an all-digital power-on reset circuit device where only logic gate devices are used and no resistors and capacitors are required. By using only logic gate devices, the all-digital power-on reset circuit can be easily incorporated into mixed-mode circuits. This further eliminates the need of having extra reset pins. The exclusive use of digital logic gates further allows the device to generate a power-on reset signal of a predetermined length without the necessity and burden to control RC circuit elements, which can be difficult to control.

Figure 1:
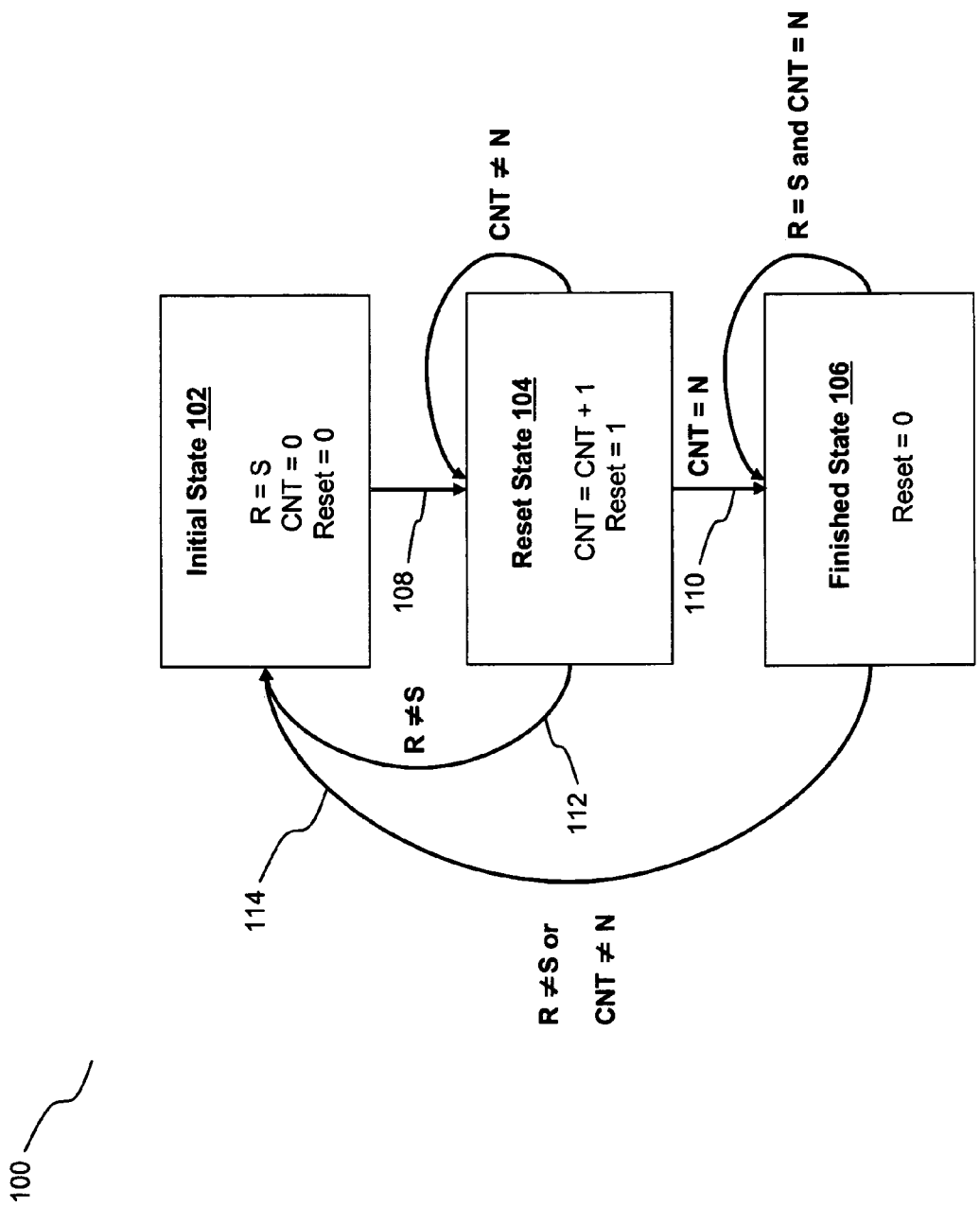
FIG. 1 illustrates a flow chart of a finite state machine that is used to determine whether a power-on reset signal has been generated in accordance with one embodiment of the present invention.

FIG. 1 illustrates a flow chart 100 of a state machine that is used to determine whether a power-on reset signal has been generated in accordance with one embodiment of the present invention. The flow chart 100 can also be seen as a de facto finite state machine comprising three states: an initial state 102, a reset state 104, and a finished state 106. Like other software designs, several variables are used within the algorithms of the finite state machine. A variable R is used to represent a m-bit data, which holds a particular content of a register. In various designs of the all-digital power-on reset device, the content of this register can be random. This random content can be compared with a predetermined signal or signature such that the system can determine whether a power-on reset signal has been generated.

A variable S is used to represent another m-bit data that contains a predetermined signature. A variable CNT is an n-bit data used for counting the number of cycles within the reset state 104 while another variable N represents an n-bit data, which contains a predetermined cycle number that determines the duration of the reset by acting as a delay.

The initial state 102 states that the variable R is equal to the variable S while the variable CNT is set to 0 without reset. The reset state 104 resets the finite state machine and provides a delay for the finite state machine where the variable CNT used as a counter is incremented until it reaches the predetermined value within variable N. When R=S and CNT=N, the reset device will move onto the finished state 106 and remain in that state as long as the variable R is equal to the variable S and the variable CNT is equal to the variable N.

After power-on of the all-digital power-on reset circuit device, the finite state machine could be in any one of the states 102, 104, or 106. If it happens to be in the initial state 102 after power-on, the reset device moves from the initial state 102 to the reset state 104 via a path 108, and finally onto the finished state 106 via another path 110 after the delay, thereby finishing the reset operation.

If the finite state machine starts from the reset state 104 or finished state 106 after power-on, since the requirement that R=S is not met, the finite state machine is brought back to the initial state 102 via a path 112 or a path 114, respectively. Once in the initial state 102, the reset device moves from the initial state 102 to the reset state 104 and onto the finished state 106. The reset device will remain at the finished state 106 as long as the conditions R=S and CNT=N are met.

Note that the value of the variable R used to represent that the m-bit random register could be any values from 0 to $2^m-1$. As the number m becomes larger, the chance that random register R happens to be equal to the predetermined signature S after power-on is very small. For this reason, the variable S should be set judiciously where the value should be more random. By carefully choosing the size of the variable R used and the pattern of the predetermined signature S, this circuit has an extremely low failure rate.

Since the registers required here can be implemented using digital elements or logic gate devices such as transistors, no analog elements such as the resistors or capacitors are needed. This invention thus provides a method for creating an all-digital power-on reset device. Since all states can be determined by comparing at least one digital bit value against another digital bit value with one or more digital logic devices, and since the counter that services a delay can also be implemented by one or more digital logic devices (e.g. one or more flip flops or a series of inverters), it is possible to implement a finite state machine in a power-on reset circuit device without the necessity to rely on RC analog time delay, which is often difficult to control and expensive to control well.

Figure 2:
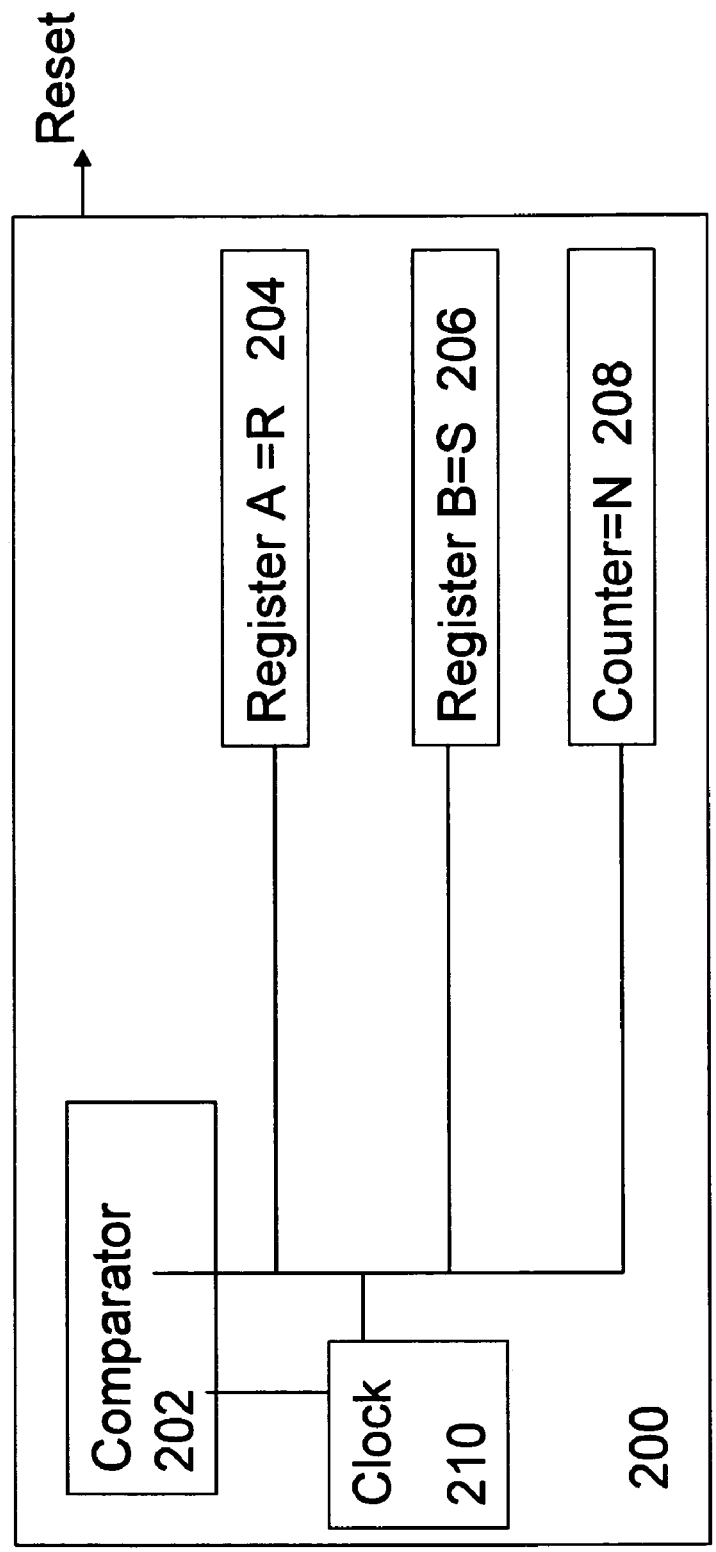
FIG. 2 illustrates an all-digital power-on system in accordance with one embodiment of the present invention.

FIG. 2 illustrates a block diagram for the all-digital power-on reset device 200 according to one embodiment of the present invention. The all-digital power-on reset device 200 has a comparator 202 that performs the data comparison between two data read from some memory space such as register A 204 and register B 206, which stores the value for R and S as described above. There is a counter 208 that is also included for performing the delay needed. A clock 210 will generate the time reference needed for all operations of the device. The clock 210 can be a clock that does not need to be reset, and that is designed to maintain stable when the state machine begins to work. Alternatively, the clock 210 can be a clock source, such as an oscillator, external to the device 200. The delay caused by this device is actually dependent on the clock signals generated for every reset cycle in which the counter is incremented. The device has a program (not shown) that is operated by some processing units to carry out the operation of the state machine as described above. A reset output is generated based on the operation of such state machine as well.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for creating a timing delay for power-on reset comprising:

resetting a counter value to a predetermined number in an initial state;

incrementing the counter value for a predetermined number of reset cycles in a reset state until the counter value reaches a predetermined value representing an n-bit data for creating the time delay;

ending the reset state in a finish state when the counter value reaches the predetermined value representing an n-bits data and when a randomly generated value matches a predetermined signature representing a m-bit data, wherein the above three states form a state machine and when in the reset state the randomly generated value does not match the signature or when in the finish state either the counter value does not reach the predetermined value or the randomly generated value does not match the signature, the initial state starts and subsequently enters the reset state after resetting the counter value.

2. The method of claim 1, wherein the timing delay is dependent on clock signals generated by the clock for every reset cycle in which the counter is incremented.

3. The method of claim 1, the timing delay is a function of the predetermined value selected for the counter.

4. The method of claim 1, wherein the randomly generated value is stored in a first register.

5. The method of claim 1, wherein the randomly generated value has a predetermined bit length so as to reduce the probability of being equal to the signature.

6. A method for creating a timing delay for power-on reset comprising:

generating a value upon power-on of a processor;

storing the generated value in a register;

resetting a counter value to a predetermined number in an initial state;

incrementing the counter value for a predetermined number of reset cycles in a reset state until the counter value reaches a predetermined value representing an n-bit data for creating the time delay;

ending the reset state in a finish state when the counter reaches the predetermined value and when the generated value matches a predetermined signature representing a m-bit data, wherein the above three states form a state machine and when in the reset state the generated value does not match the signature or when in the finish state either the counter value does not reach the predetermined value or the generated value does not match the signature, the initial state starts and subsequently enters the reset state after resetting the counter value.

7. The method of claim 1, wherein the timing delay is dependent on clock signals generated by the clock for every reset cycle in which the counter is incremented.

8. The method of claim 1, the timing delay is a function of the predetermined value selected for the counter.

9. The method of claim 1, wherein the generated value is a randomly generated value with a predetermined bit length for reducing the probability of being equal to the signature.

10. A system for creating a timing delay for power-on reset comprising:
- a counter;
- a clock;
- a comparator;
- a first register for storing a randomly generated value of a predetermined bit length;
- a second register for storing a predetermined signature of the same bit length as the randomly generated value;
- a state machine program directing the above elements for performing:
- resetting a counter value to a predetermined number in an initial state;
- incrementing the counter value for a predetermined number of reset cycles in a reset state until the counter value reaches a predetermined value representing an n-bit data for creating the time delay;
- ending the reset state in a finish state when the counter value reaches the predetermined value representing an n-bit data and when the randomly generated value matches the predetermined signature representing the predetermined bit length,
- wherein when in the reset state the randomly generated value does not match the signature or when in the finish state either the counter value does not reach the predetermined value or the randomly generated value does not match the signature, the initial state starts and subsequently enters the reset state after resetting the counter value.

11. The system of claim 10, wherein the timing delay is dependent on clock signals generated by the clock for every reset cycle in which the counter is incremented.

12. The system of claim 10, wherein the randomly generated value has a predetermined bit length so as to reduce the probability of being equal to the signature.

* * * * *